(12) United States Patent
Hohlfeld et al.

(10) Patent No.: US 8,134,837 B2
(45) Date of Patent: Mar. 13, 2012

(54) TWIST-SECURED ASSEMBLY OF A POWER SEMICONDUCTOR MODULE MOUNTABLE ON A HEAT SINK

(76) Inventors: Olaf Hohlfeld, Warstein (DE); Peter Kanschat, Soest (DE); Thilo Stolze, Arnsberg (DE)

( * ) Notice: Subject to any disclaimer, the term of this patent is extended or adjusted under 35 U.S.C. 154(b) by 7 days.

(21) Appl. No.: 12/777,656

(22) Filed: May 11, 2010

(65) Prior Publication Data

US 2010/0284153 A1 Nov. 11, 2010

(51) Int. Cl.
*H05K 7/20* (2006.01)

(52) U.S. Cl. ............. 361/718; 361/679.46; 361/679.54; 361/704; 361/709; 361/719; 165/80.3; 165/104.33; 165/185; 174/16.3; 174/252

(58) Field of Classification Search ............. 361/679.46, 361/679.54, 688, 689, 690–697, 700–712, 361/717–728, 736, 820; 165/80.3, 104.33, 165/185; 257/706–727; 174/16.3, 252, 52.01; 363/141, 143, 144
See application file for complete search history.

(56) References Cited

U.S. PATENT DOCUMENTS

| 5,010,949 | A | * | 4/1991 | Dehaine .......................... 165/76 |
| 5,304,735 | A |   | 4/1994 | Earl et al. |
| 5,402,077 | A | * | 3/1995 | Agahdel et al. .......... 324/756.02 |
| 5,497,289 | A | * | 3/1996 | Sugishima et al. ............ 361/709 |
| 6,058,014 | A | * | 5/2000 | Choudhury et al. .......... 361/704 |
| 6,209,623 | B1 | * | 4/2001 | Tantoush ...................... 165/80.3 |
| 6,318,451 | B1 | * | 11/2001 | Lee et al. ...................... 165/80.3 |
| 6,829,144 | B1 |   | 12/2004 | Stutzman et al. |
| 7,203,065 | B1 | * | 4/2007 | Sin Yan Too .................. 361/704 |
| 7,242,583 | B2 | * | 7/2007 | Amber et al. .................. 361/707 |
| 7,270,176 | B2 |   | 9/2007 | Bell et al. |
| 7,679,919 | B2 | * | 3/2010 | Lee ................................ 361/719 |

FOREIGN PATENT DOCUMENTS

| JP | 3-183157 A | | 8/1991 |
| JP | 2008205364 A | * | 9/2008 |
| WO | 99/00843 A1 | | 1/1999 |

* cited by examiner

*Primary Examiner* — Michail V Datskovskiy
(74) *Attorney, Agent, or Firm* — Murphy, Bilak & Homiller, PLLC

(57) ABSTRACT

A power semiconductor module system includes a power semiconductor module, a heat sink and at least one fastener. The power semiconductor module includes a bottom side with a first thermal contact surface and the heat sink includes a top side with a second thermal contact surface. The power semiconductor module is conjoined with the heat sink by means of the at least one fastener. The power semiconductor module includes a number $N1 \geq 1$ of first positioning elements and the heat sink a number $N2 \geq 1$ of second positioning elements. Each of the first positioning elements corresponds to one of the second positioning elements and forms a pair therewith. The power semiconductor module and the heat sink are alignable relative to one another so that the two positioning elements of each of the pairs are interfitted when the power semiconductor module is mounted on the heat sink.

21 Claims, 5 Drawing Sheets

US 8,134,837 B2

TWIST-SECURED ASSEMBLY OF A POWER SEMICONDUCTOR MODULE MOUNTABLE ON A HEAT SINK

PRIORITY CLAIM

This application claims priority to German Patent Application No. 10 2009 002 992.3-33 filed on 11 May 2009, the content of which is incorporated herein by reference in its entirety.

FIELD OF TECHNOLOGY

The invention relates to power semiconductor modules as employed, for example, in converters.

BACKGROUND

As a rule, power semiconductor modules are mounted on a heat sink for cooling. In addition, these modules may be connected to electrical circuiting means such as, e.g., printed circuit boards or busbars to externally connect them. This is why the module and the heat sink need to be mechanically aligned and thermally contacted to corresponding thermal contact surface to make the contact. It is particularly when making use of viscous and heat-conductive paste between the module and the heat sink, e.g., a heat-conductive paste, that it may happen that the module becomes twisted relative to the heat sink, resulting in the heat-conductive as originally defined in its thickness distribution becoming smudged, rendering its application haphazard.

This is particularly a problem when just a single fastener, such as a screw, is used to conjoin the power semiconductor module to the heat sink, although even when two or more fasteners are used this may be a problem due to the threaded hole needing to be sufficiently oversized to facilitate threading the screws. In this case too, the module may become twisted relative to the heat sink, smudging the heat-conductive pastes.

Therefore, one aspect of the present invention is thus to provide a power semiconductor module which can now be mounted reliably twist-secured on a heat sink. A further aspect involves a method of mounting a power semiconductor module reliably twist-secured on a heat sink.

SUMMARY

A power semiconductor module system as described in the following includes a power semiconductor module and a heat sink as well as at least one fastener by means of which the power semiconductor module can be conjoined to the heat sink. The power semiconductor module includes a bottom side with a first thermal contact surface, the heat sink correspondingly includes a top side with a second thermal contact surface. Dissipating the heat of the power semiconductor module is then achieved by bringing the first thermal contact surface into contact with the second thermal contact surface.

In addition, the power semiconductor module includes a number $N1 \geqq 1$ of first positioning elements, the heat sink a number $N2 \geqq 1$ of second positioning elements, each of the first corresponding to each of the second in forming a pair. This now makes it possible to arrange the power semiconductor module and the heat sink so that the two positioning elements of each pair are interfitted fully or at least partly when the power semiconductor module is mounted on the heat sink, resulting in the power semiconductor module and the heat sink being interrelatably twist-secured and then conjoined with the use of at least one fastener.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

In the following Detailed Description, reference is made to the accompanying drawings, which form a part hereof, and in which is shown by way of illustration specific embodiments in which the invention may be practiced. In this regard, directional terminology, such as "top", "bottom", "front", "back" "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

DETAILED DESCRIPTION

Figure 1A:
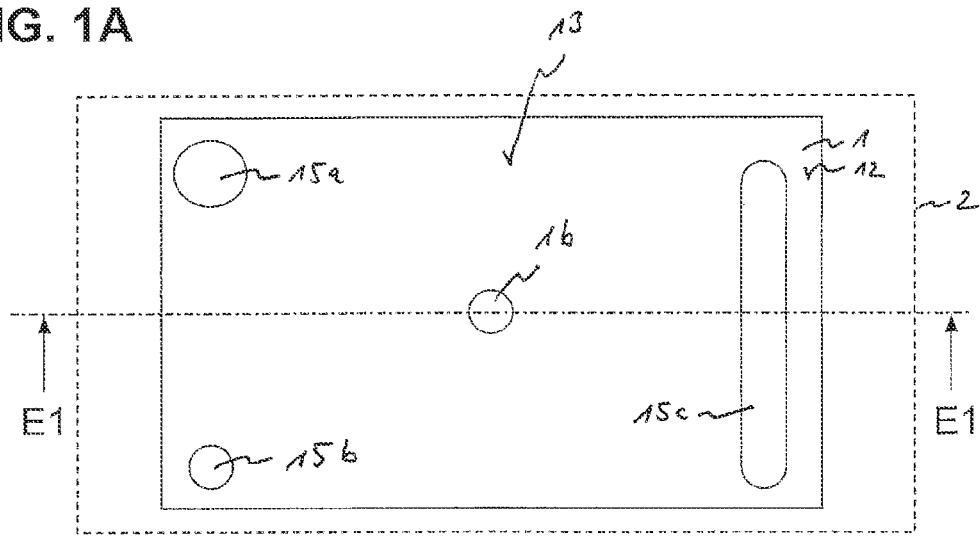
FIG. 1A is a diagrammatic view of an embodiment of the bottom of a power semiconductor module featuring several positing elements configured as protuberances.

Referring now to FIG. 1A there is illustrated a power semiconductor module 1 featuring a view of its bottom side 12. The majority of the bottom side 12 is taken up by a first thermal contact surface 13 provided to dispel the heat created in operation of the power semiconductor module in the direction of the heat sink 2 to be contacted with the first thermal contact surface 13. The side definition of a heat sink 2 to be contacted to the bottom side 12 is depicted with dashed lines. Provided at the bottom side 12 are several first positioning elements 15a, 15b, 15c configured as protuberances extending beyond the first thermal contact surface 13 in the direction of the heat sink 2 to be mounted. Sideways, roughly in its middle, the power semiconductor module 1 includes a sole central fastener threaded hole 1b fully passing through the power semiconductor module 1 perpendicular to the first thermal contact surface 13.

Figure 1B:
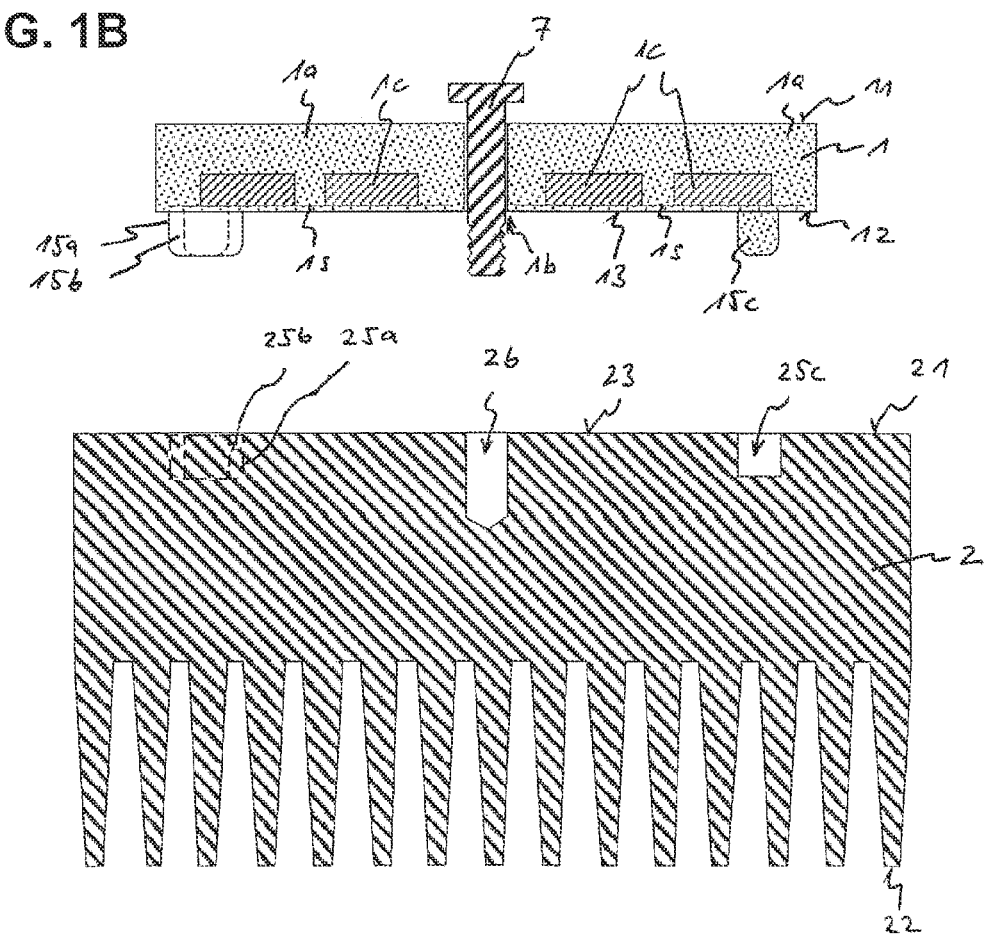
FIG. 1B is a vertical section through a power semiconductor module system including a power semiconductor module as shown in FIG. 1A in a section plane E1 which is screwed to a heat sink by means of a fastener.

Referring now to FIG. 1B there is illustrated a vertical section through the power semiconductor module as shown in FIG. 1A, in a section plane E1 as indicated therein showing in addition the heat sink 2 as well as a fastener 7 configured as a screw serving to conjoin the power semiconductor module 1 and the heat sink 2. Instead of just one such fastener—the same as in all aspects—two or more fasteners may also be provided to connect the power semiconductor module 1 to the heat sink 2.

The heat sink 2 features a top side 21 and opposite thereto a bottom side 22. The top side 21 is mainly taken up by a flat or at least approximately flat second thermal contact surface 23 to be brought into thermal contact with the first thermal contact surface 13 of the power semiconductor module 1, to dispel the heat materializing in operation of the power semiconductor module 1 as caused by, for example, power semiconductor chips 1c, e.g., IGBTs, diodes, Thyristors, MOSFETs, JFETs or any other power semiconductor chips. On the power semiconductor module 1 the power semiconductor chips 1c are mounted on substrates such as, for instance, ceramic platelets metalized on one or both sides, for example, as direct copper bonding (DCB), direct aluminum bonding (DAB) or active metal brazing (AMB) substrates mounting the power semiconductor chips 1c.

For each of the first positioning elements 15a, 15b, 15c the heat sink 2 includes a corresponding second positioning element 25a, 25b and 25c respectively, each configured, for example, as a recess in the heat sink 2. The first positioning element 15a, 15b, 15c of the power semiconductor module 1 are shaped and/or sited on the bottom side 12 so that the power semiconductor module 1 can only be mounted interfitted twist-secured on the heat sink 2 in simultaneously making a thermal contact between the first thermal contact surface 13 of the power semiconductor module 1 and the second thermal contact surface 23 of the heat sink 2.

When mounting the power semiconductor module 1 on the top side 21 of the heat sink 2 the power semiconductor module 1 is aligned so that the first thermal contact surface 13 and second thermal contact surface 23 face each other and each of the first positioning elements 15a, 15b, 15c of the power semiconductor module 1 is located opposite the corresponding second positioning element 25a, 25b respectively 25c of the heat sink 2. Once the power semiconductor module 1 is aligned relative to the heat sink 2 the power semiconductor module 1 is mounted on the heat sink 2 so that each first positioning elements 15a, 15b, 15c interfits the corresponding second positioning elements 25a, 25b respectively 25c, after which the power semiconductor module 1 is and the heat sink 2 are conjoined with the aid of the fastener 7. For this purpose, the heat sink 2 includes a threaded hole 2b the screw thread of which is not shown in FIG. 1B.

In the power semiconductor module 1 as shown in FIGS. 1A and 1B the first positioning elements 15a and 15b are configured as pins of differing diameter and the positioning element 15c as an elongated web whilst the corresponding second positioning elements of the heat sink 2 are configured as second positioning elements 25a and 25b respectively of differing diameter and positioning element 25c as a groove. The geometries of the first positioning elements 15a, 15b, 15c of the power semiconductor module 1 are adapted to the geometries of the corresponding second positioning elements 25a, 25b respectively 25c so that each of the first positioning elements 15a, 15b, 15c interfits a corresponding second positioning element 25a, 25b respectively 25c.

In the view as shown in FIG. 1B, the locations of the first positioning element 15b and of the second positioning elements 25a and 25b are not evident and are thus simply depicted with dashed lines.

It is understood that the shape and location of the first positioning elements 15a, 15b, 15c at the bottom side 12 of the power semiconductor module 1 and the shape and location of the second positioning elements 25a, 25b respectively 25c on the top side 21 of the heat sink 2 are merely by way of an example. In other words, the shape and location of the first positioning elements 15a, 15b, 15c at the bottom side 12 of the power semiconductor module 1 and the shape and location of the second positioning elements 25a, 25b respectively 25c on the top side 21 of the heat sink 2 may be any, as long as they assure that the power semiconductor module 1—as regards any possible axis of rotation oriented perpendicular to the first thermal contact surface 13 and second thermal contact surface 23—can only be mounted interfitted to top the heat sink 2 so that each of the first positioning elements 15a, 15b, 15c interfits the corresponding second positioning elements 25a, 25b respectively 25c.

To make sure that only one sole twist-secured location is possible, at least one or at least two of the positioning elements, e.g., from the total of the first and second positioning elements may be configured elongated, extending parallel to the first thermal contact surface 13 and/or second thermal contact surface 23 respectively.

Likewise, for example, at least three positioning elements of the total of the first and second positioning elements may be configured as pins.

Figure 2A:
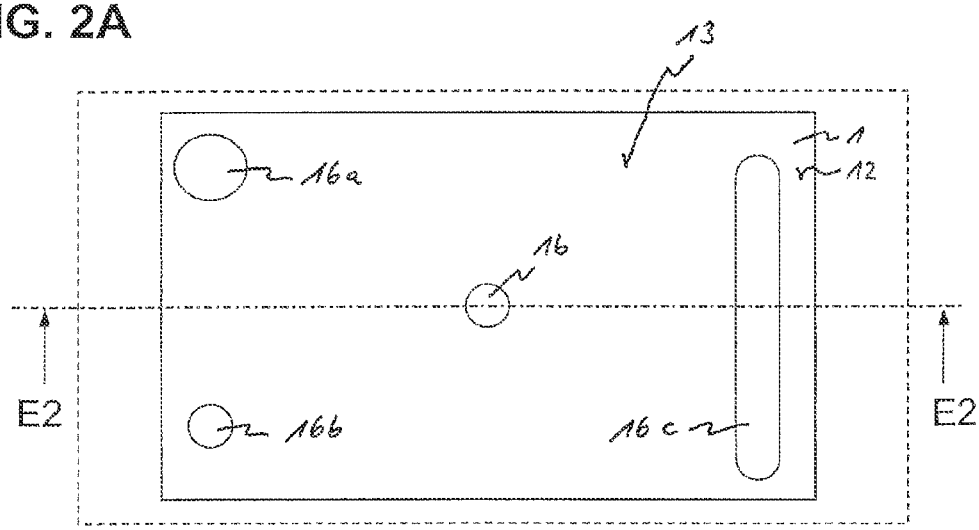
FIG. 2A is a diagrammatic view of another embodiment of the bottom of a power semiconductor module featuring several positioning elements configured as recesses.

Referring now to FIG. 2A there is illustrated the bottom side 12 of a power semiconductor module 1 which differs from the power semiconductor module 1 as shown in FIG. 1A by the first positioning elements 16a, 16b, 16c not being configured like the first positioning elements 15a, 15b, 15c as shown in package 1A as protuberances but as recesses relative to the first thermal contact surface 13.

Figure 2B:
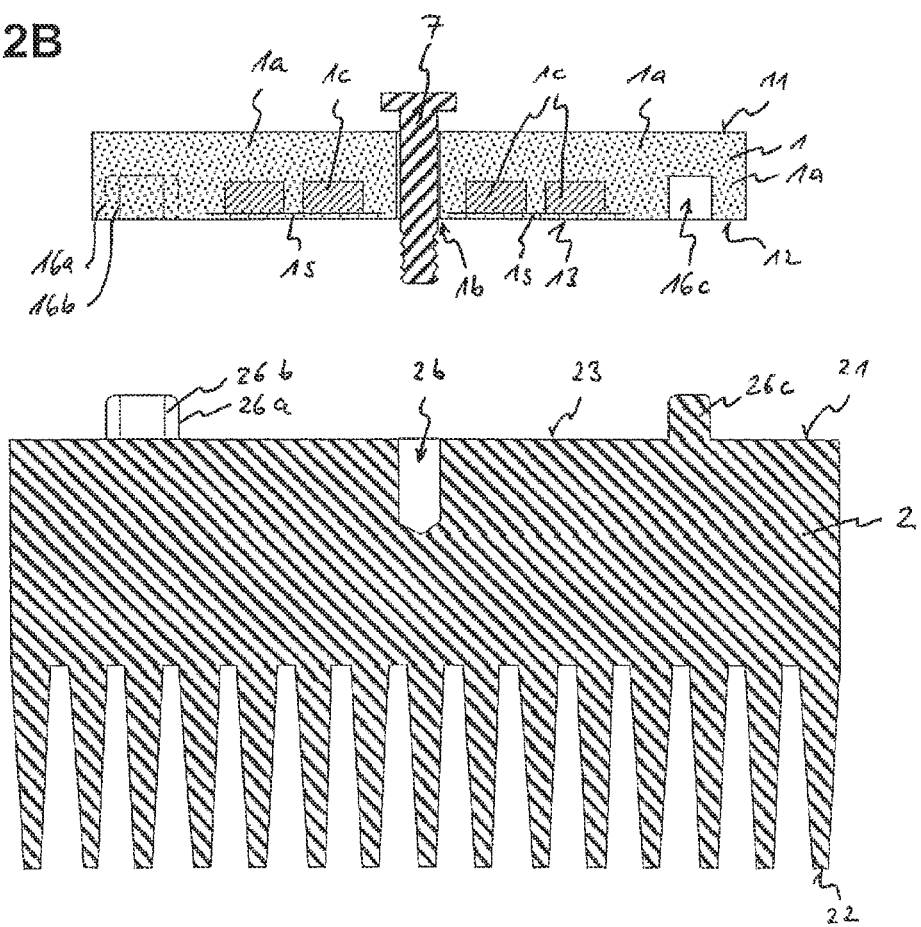
FIG. 2B is a vertical section through a power semiconductor module system including a power semiconductor module as shown in FIG. 2A in a section plane E2 which is screwed to a heat sink by means of a fastener.

Referring now to FIG. 2B there is illustrated a vertical section through the power semiconductor module 1 as shown in FIG. 2A in a section plane E2 as well as a heat sink 2 to which the power semiconductor module 1 is to be secured by means of a fastener 7 configured as a screw.

In the view as shown in FIG. 2B it is evident that the first positioning elements 16a, 16b, 16c—in relation to the first thermal contact surface 13 of the power semiconductor module 1 are configured as recesses in the power semiconductor module 1. Accordingly the second positioning elements 26a, 26b, 26c corresponding to the first positioning elements 16a, 16b, 16c—in relation to the second thermal contact surface 23 of the heat sink 2—are configured as protuberances extending beyond the second thermal contact surface 23 in the direction of power semiconductor module 1 to be mounted thereon.

Whilst in the power semiconductor modules 1 and heat sinks 2 as shown in FIGS. 1A, 1B, 2A and 2B the first positioning elements 15a, 15b, 15c or 16a, 16b, 16c are spaced away from the side edge of the bottom side 12 of the power semiconductor module 1 and the second positioning elements 25a, 25b, 25c or 26a, 26b, 26c are spaced away from the side edge of the top side 21 of the heat sink 2, the first positioning elements 17a, 17b, 17c of the power semiconductor module 1 as shown in FIG. 3 are arranged directly at the side edge of the bottom side 12 thereof.

Figure 3A:
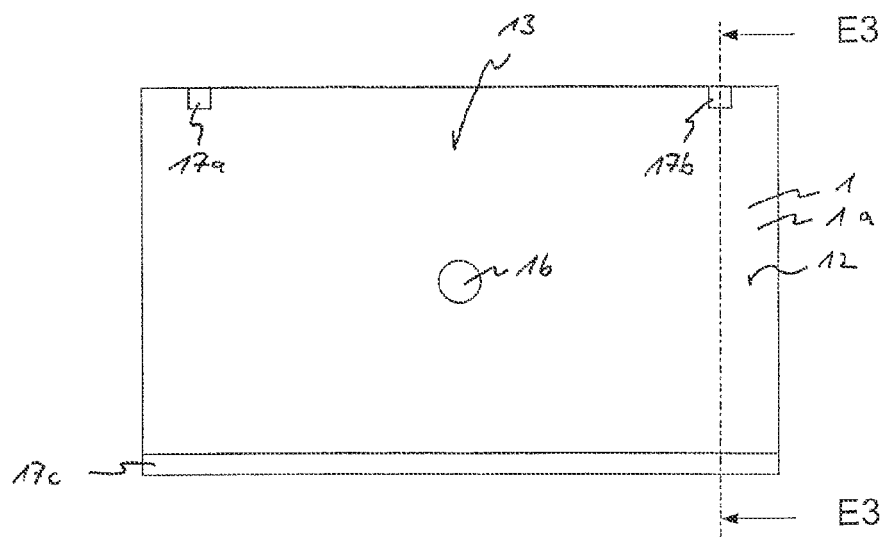
FIG. 3A is a diagrammatic view of yet another embodiment of the bottom of a power semiconductor module featuring several positioning elements arranged on one side edge thereof.

Referring now to FIG. 3a—like the FIGS. 1A and 2A—there is illustrated the power semiconductor module 1 with a view of its bottom side 12 without the heat sink mounted. The first positioning elements 17a and 17b configured a pin-type protuberances and the 17c configured as a key-type protuberance extends beyond the first thermal contact surface 13 of the power semiconductor module 1 in the direction of the heat sink to be mounted.

Figure 3B:
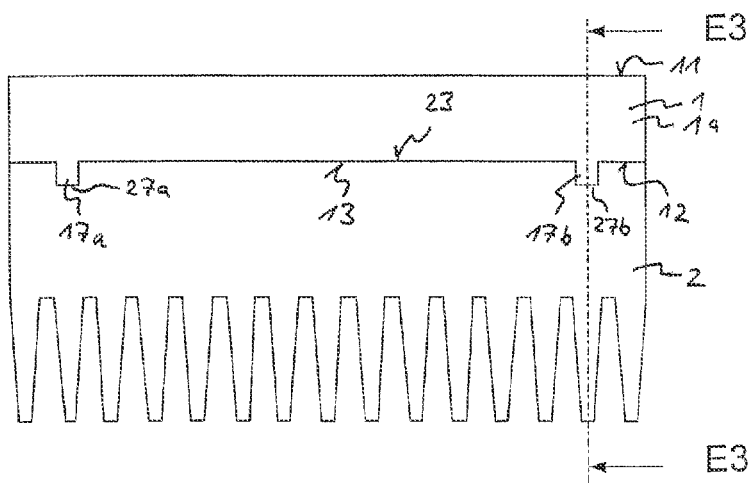
FIG. 3B is a side view of the power semiconductor module as shown in FIG. 3A after being mounted on a heat sink.
Figure 3C:
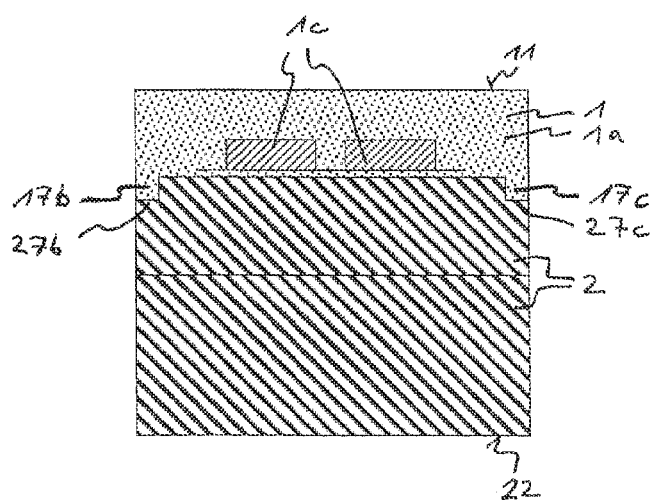
FIG. 3C is a vertical section through the arrangement as shown in FIG. 3B in a section plane E3 as shown in FIGS. 3A and 3B.

Referring now to FIG. 3B there is illustrated a side view of the power semiconductor module 1 as shown in FIG. 1 mounted on the heat sink 2 whilst FIG. 3C is a vertical section through the assembly in a section plane E3 as shown in FIGS. 3A and 3B.

Referring now to FIGS. 3B and 3C it is evident that each of the first positioning elements 17a, 17b, 17c configured as protuberances of the power semiconductor module 1 interfit a corresponding second positioning element 27a, 27b, 27c configured as a recess in the heat sink 2 relative to the second thermal contact surface 23 when the first thermal contact surface 13 of the power semiconductor module 1 and the second thermal contact surface 23 of the heat sink 2 are thermally in contact with each other, positioning element 27a being out of view in FIG. 3C. In this configuration the first positioning elements 17a, 17b, 17c are arranged at the side edge of the bottom side 12 of the power semiconductor module 1 and the second positioning elements 27a, 27b, 27c are arranged at the side edge of the top side 21 of the heat sink 2. The first positioning elements 17a, 17b, 17c form a bracket clasping the top end of the heat sink 2.

Figure 4A:
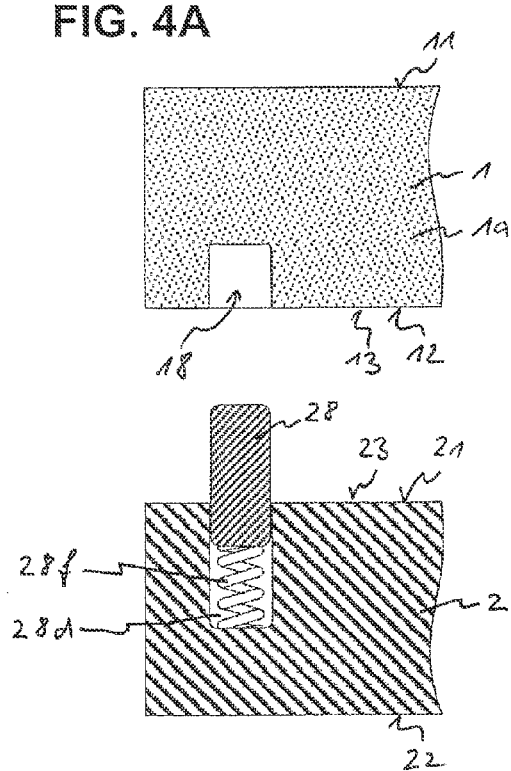
FIG. 4A is a vertical section through a portion of a power semiconductor module system including a power semiconductor module and a heat sink featuring a spring positioning element according to an embodiment.

Referring now to FIG. 4A there is illustrated a vertical section through a portion of a power semiconductor module system comprising a power semiconductor module 1 and a heat sink 2. The heat sink 2 features a second positioning element 28 configured, for example, as a pin extending beyond the top side 21 of the heat sink 2 in the direction of the power semiconductor module 1 to be mounted. The second positioning element 28 is spring-mounted by means of a resilient key 28f, for example by a pressure spring, so that it can be urged fully or partly into a receiving space 28d of the heat sink 2 in overcoming the force exerted by the keying resilient key 28f. The power semiconductor module 1 includes, corresponding to the second positioning element 28, a first positioning element 18 which—relative to the first thermal contact surface 13—is configured as a recess in the power semiconductor module 1. Instead of a pressure spring 28f, any other type of a resilient key can be employed to urge the positioning element 28 in the direction of the power semiconductor module 1 to be mounted.

Figure 4B:
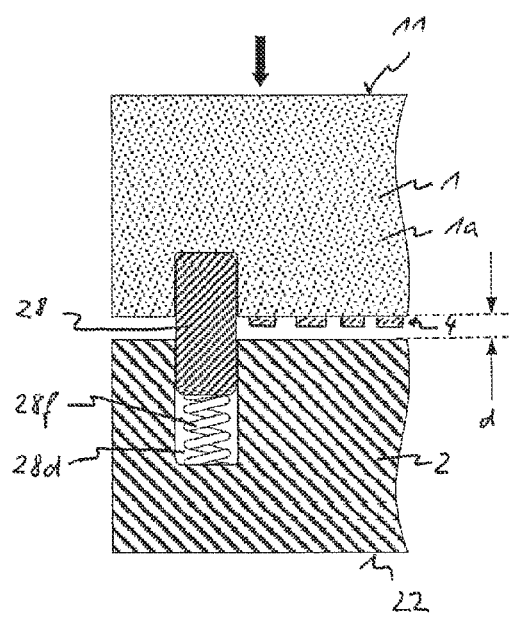
FIG. 4B is a diagrammatic view of the power semiconductor module system as shown in FIG. 4A after mounting of the power semiconductor module on the heat sink such that the positioning element of the heat sink interfits a corresponding positioning element of the power semiconductor module.

Referring now to FIG. 4B there is illustrated how when the power semiconductor module 1 is mounted on the heat sink 2 so that the first thermal contact surface 13 of the power semiconductor module and the second thermal contact surface 23 of the heat sink 2 face each other and the first positioning element 18 of the power semiconductor module 1 and the movable second positioning elements 28 of the heat sink 2 are located opposite each other, the first positioning element 18 and the second positioning element 28 can be interfitted to thus polarize the power semiconductor module 1 relative to the heat sink 2 as regards an axis of rotation perpendicular to the first thermal contact surface 13 and the second thermal contact surface 23.

The elasticity of the resilient key 28f is selected so that the first thermal contact surface 13 and the second thermal contact surface 23—when the power semiconductor module 1 is located loosely (in other words without the effect of an external force and simply by the effect of its own weight when mounted in proper sense on the heat sink 2) on the top side 21 of the heat sink 2—feature a spacing d which is greater than the thickness of a heat-conductive paste 4 applied to the first thermal contact surface 13. The heat-conductive paste 4 which may be configured as a continuous layer or as shown. As a patterned layer may involve, for example, a heat-conductive paste. Alternatively or in addition thereto, the heat-conductive paste 4 may also be applied to the second thermal contact surface 22.

The elasticity of the resilient key 28f is selected in any case a heat-conductive paste 4 applied to the first thermal contact surface 13 and/or second thermal contact surface 23 results nowhere in a direct thermal bridging between the first thermal contact surface 13 and the second thermal contact surface 23 when the power semiconductor module 1, as explained above, is located loosely on the top side 21 of the heat sink 2.

This makes sure that a heat-conductive paste 4 applied to the first thermal contact surface 13 and/or to the second thermal contact surface 23 is not inadvertently smudged by the power semiconductor module 1 being moved relative to the heat sink 2 after the power semiconductor module 1 is mounted on the top side 21 of the heat sink 2 and before and power semiconductor module 1 and heat sink 2 are conjoined by a fastener.

When subsequently conjoining the power semiconductor module 1 and the heat sink 2 in using a fastener (not shown), for example, by means of a screw—as shown in FIGS. 1B and 2B—the power semiconductor module 1 and heat sink 2 are pressed together so that the second positioning element 28 is urged into the receiving space 28d of the heat sink 2 in overcoming the spring force of the resilient key 28f until a satisfactory thermal contact materializes between the first thermal contact surface 13 and second thermal contact surface 23 due to the heat-conductive paste 4 sandwiched between the first thermal contact surface 13 and second thermal contact surface 23. This results in the heat-conductive paste 4 applied patterned being spread sideways into the gaps in the pattern so that the heat-conductive paste 4, once the power semiconductor module 1 is conjoined with the heat sink 2, ideally forms a full-surface layer contacting the first thermal contact surface 13 to the second thermal contact surface 23 free of any discontinuity.

Figure 5A:
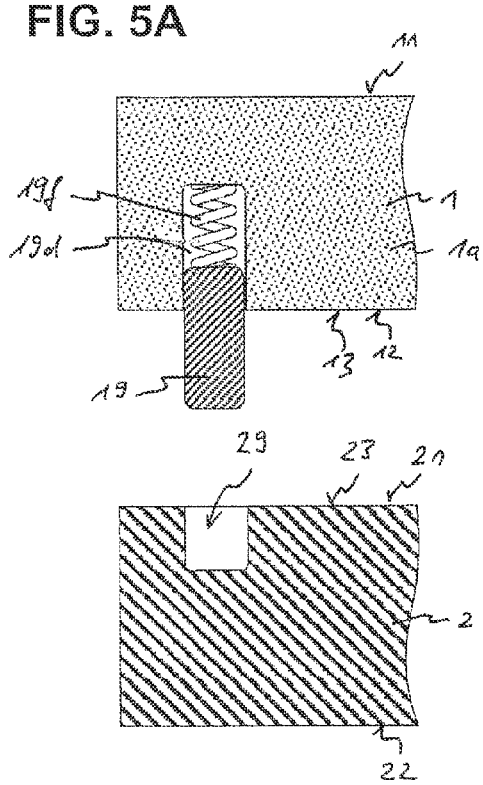
FIG. 5A is a vertical section through a portion of a power semiconductor module system including a power semiconductor module and a heat sink, the power semiconductor module featuring a spring positioning element according to another embodiment.
Figure 5B:
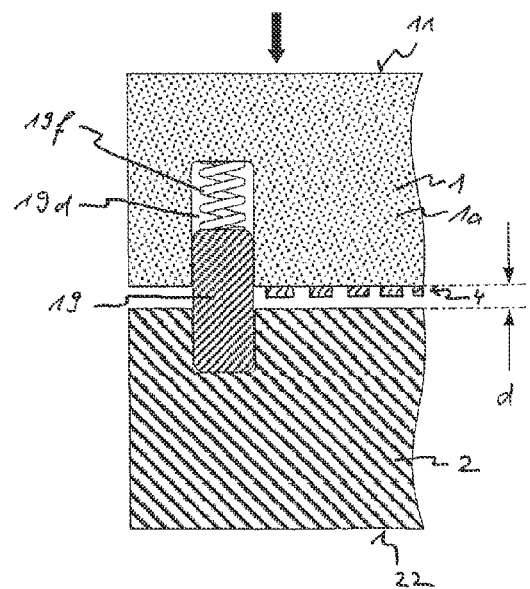
FIG. 5B is a diagrammatic view of the power semiconductor module system as shown in FIG. 5A after mounting of the power semiconductor module on the heat sink such that the positioning element of the power semiconductor module interfits a corresponding positioning element of the heat sink.

Referring now to FIGS. 5A and 5B the power semiconductor module system as shown therein has substantially the same properties as the power semiconductor module system as already discussed with reference to FIGS. 4A and 4B and thus reference is made thereto. However, the difference between that as shown in FIGS. 5A and 5B as compared to that as shown in FIGS. 4A and 4B is that the structure and effect of a first positioning element 19 of the power semiconductor module 1 including a resilient key 19f and a receiving space 19d configured in the power semiconductor module 1 corresponds to the structure and effect of the second positioning element 28 and its cooperation with the resilient key 28f and the receiving space 28d as shown in FIGS. 4A and 4B and that the second positioning element 29 corresponding to the first positioning element 18 as shown in FIGS. 5A and 5B corresponds to the positioning elements 28 as shown in FIGS. 4A and 4B as regards its structure and cooperation with the positioning element 19.

In a departure from the illustrations as shown in FIGS. 4A, 4B, 5A, 5B the movable positioning element 28 and 19 respectively as shown in these Figures can be captively conjoined to the heat sink 2 and power semiconductor module 1 respectively by suitably means, such as, for example, by means of latching keys or by guide fingers configured sideways on the movable positioning elements 19 and 28 designed to interfit in corresponding grooves machined in the sidewalls of the corresponding receiving space 28d or 19d respectively.

Figure 6:
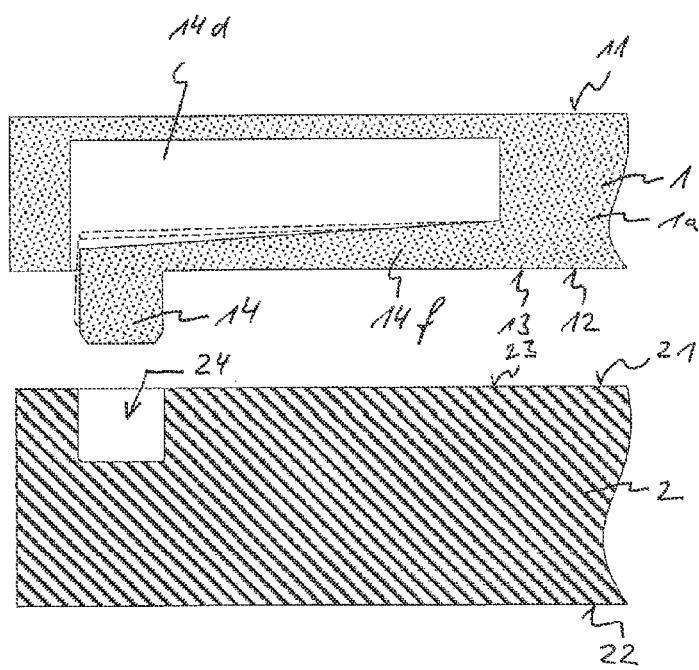
FIG. 6 is a vertical section through a portion of a power semiconductor module system in which the power semiconductor module includes a spring positioning element configured integrally with the package of the power semiconductor module according to yet another embodiment.

Referring now to FIG. 6 there is illustrated a vertical section through another aspect of a power semiconductor module system featuring a movably located first positioning element 14. The positioning element 14 is conjoined with the power semiconductor module 1 by means of a resilient key 14f formed by a spring portion of the package 1a. Due to the elasticity of the resilient key 14f the positioning element 14 can be urged fully, i.e., down to at least the level of the first thermal contact surface 13 in the receiving space 14d due to the effect of the external force.

The elasticity of the resilient key 14f is dimensioned so that the first thermal contact surface 13 is spaced away from the second thermal contact surface 23 when the power semiconductor module 1 is placed loosely, in other words simply by the effect of its own weight, on the top side 21 of the heat sink 2, so that the first positioning element 14 is inserted in a corresponding second positioning element 24 of the heat sink 2 configured as a recess and so that the first positioning element 14 and the second positioning element 24 are interfitted at least in part. In the same way, as in the assemblies as illustrated in the FIGS. 1B, 2B, 3B, 3C, 4A, 4B as well as in all power semiconductor module systems in accordance with the present invention a heat-conductive paste (not shown in FIG. 6) can be applied to the first thermal contact surface 13 of the power semiconductor module 1 and/or to the second thermal contact surface 23 of the heat sink 2 before mounting the power semiconductor module 1 on the heat sink 2, to optimize the thermal contact between the first thermal contact surface 13 and the second thermal contact surface 23.

Figure 7A:
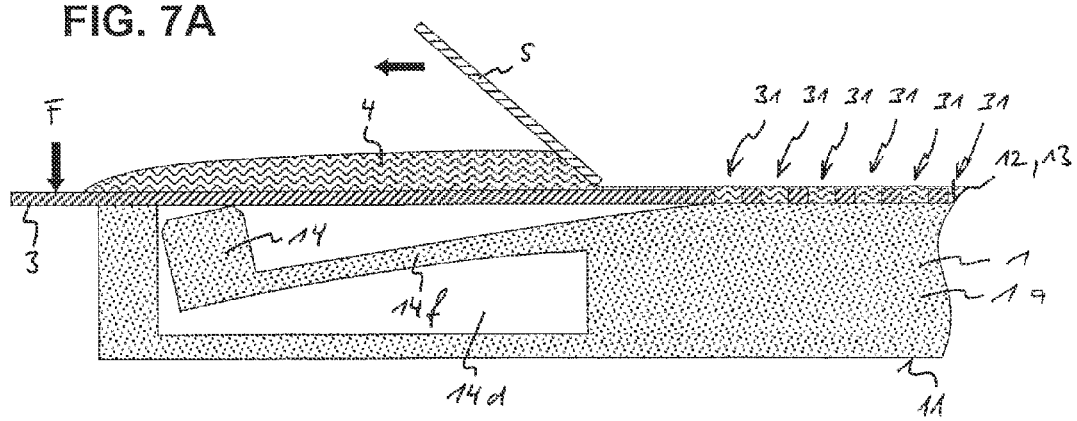
FIG. 7A is a diagrammatic view of the power semiconductor module as shown in FIG. 6 but during application of a heat-conductive paste to the thermal contact surface of the module by means of a screen and doctor blade.
Figure 7B:
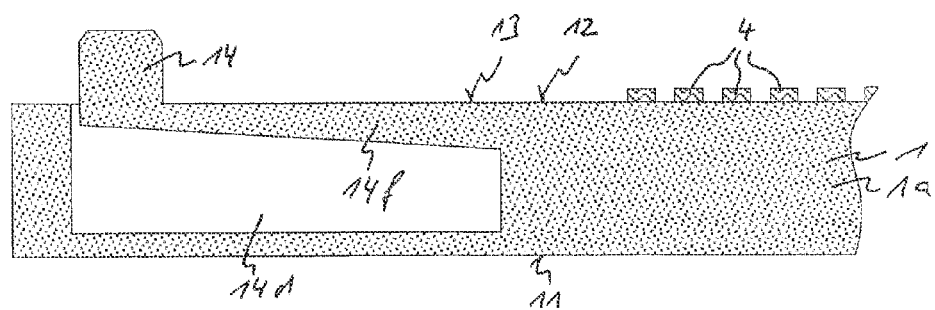
FIG. 7B is a diagrammatic view of the power semiconductor module as shown in FIG. 7A but after removal of the screen with the patterned application of the heat-conductive paste.

Referring now to the subsequent FIGS. 7A and 7B there is illustrated how a heat-conductive paste 4 can be applied to the first thermal contact surface 13 of the power semiconductor module 1 as shown in FIG. 6 including a movable positioning element 14.

Referring now to FIG. 7A there is illustrated how for this purpose a screen 3 featuring openings 31 or alternatively a stencil provided with openings is impressed to the bottom side 12 of the power semiconductor module 1 so that the first positioning element 14 is urged fully or at least partly into the receiving space 14d by the effect of the pressing force F of the screen 3 in biasing the resilient key 14f, resulting in the screen 3 or stencil coming into contact with the first thermal contact surface 13 or minimally spaced away therefrom to permit a coating of a heat-conductive paste 4 with use of the screen 3 or stencil.

The heat-conductive paste applied to the screen 3 or stencil can be skimmed off by means of a doctor blade 5 from the top of the screen 3 so that the heat-conductive paste 4 fills the openings 31 of the screen 3 or stencil.

After removal of the screen 3 or stencil from the first thermal contact surface 13 there remains on the first thermal contact surface 13 a layer of the heat-conductive paste 4 patterned in accordance with the openings 31. The first positioning element 14 detracts to its starting position as shown in FIG. 6 once the screen 3 or stencil is removed.

When suitably configured, any of the movable positioning elements of a power semiconductor module 1 can be urged fully or at least partly into the corresponding receiving space 14d or 19d (see FIGS. 5A and 5B) once a heat-conductive paste 4 has been applied to the first thermal contact surface 13 thereof. In addition, a heat-conductive paste can be applied correspondingly to the thermal contact surface 23 of a heat sink 2 featuring a movable positioning element 28 (see FIGS. 4A and 4B) temporarily urged fully or partly into a receiving space 28f of the heat sink 2 in overcoming the spring force of a resilient key 28d.

It is understood that although the invention has been explained by way of examples it is not restricted to these examples. Especially the totality of the first positioning elements of the power semiconductor module may involve one or more positioning elements which—relative to the first thermal contact surface—are configured as bumps as well as one or more positioning elements configured as recesses or concavities just like the totality of the second positioning elements of the heat sink may involve one or more positioning elements which—relative to the second thermal contact surface—configured as bumps as well as one or more positioning elements configured as recesses or concavities.

In addition to this, the first positioning elements of the power semiconductor module and the second positioning elements of the heat sink corresponding thereto may be designed so as to not enable a form-locked and/or force-locked joint between the power semiconductor module and the heat sink.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module system, comprising:
    a power semiconductor module including a bottom side with a first thermal contact surface;
    a heat sink including a top side with a second thermal contact surface;
    at least one fastener by means of which the power semiconductor module is conjoinable with the heat sink;
    wherein the power semiconductor module includes a number $N1 \geq 1$ of first positioning elements, the heat sink a number $N2 \geq 1$ of second positioning elements, each of the first positioning elements corresponding to one of the second positioning elements and forming a pair therewith;
    wherein the power semiconductor module and the heat sink are alignable relative to one another so that the two positioning elements of each of the pairs are interfitted when the power semiconductor module is mounted on the heat sink; and
    wherein the power semiconductor module system has at least one of a first configuration and a second configuration, the first configuration comprising at least one of the first positioning elements being movable relative to the first thermal contact surface and being resiliently located by means of a resilient key for forced insertion at least partly into a receiving space provided on the power semiconductor module when mounting the power semiconductor module on the heat sink; and the second configuration comprising at least one of the second positioning elements being movable relative to the second thermal contact surface and being resiliently located by means of a resilient key for forced insertion at least partly into a receiving space provided on the heat sink when mounting the power semiconductor module on the heat sink.

2. The power semiconductor module system as set forth in claim 1, wherein in the first configuration, at least one of the first positioning elements is conjoined with the power semiconductor module.

3. The power semiconductor module system as set forth in claim 1, wherein in the second configuration, at least one of the second positioning elements is conjoined with the heat sink.

4. The power semiconductor module system as set forth in claim 1, wherein in the first configuration, at least one of the first positioning elements is configured as a protuberance extending beyond the first thermal contact surface.

5. The power semiconductor module system as set forth in claim 1, wherein the first thermal contact surface and the second thermal contact surface are spaced apart from each other when the power semiconductor module is mounted with its bottom side facing downward on the heat sink so that each first positioning element interfits the corresponding second positioning element.

6. The power semiconductor module system as set forth in claim 1, wherein in the second configuration, at least one of the first positioning elements is configured as a recess or recess in the first thermal contact surface.

7. The power semiconductor module system as set forth in claim 1, wherein in the second configuration, at least one of the second positioning elements is configured as a protuberance extending beyond the second thermal contact surface.

8. The power semiconductor module system as set forth in claim 1, wherein in the first configuration, at least one of the second positioning elements is configured as a recess or as a recess in the second thermal contact surface.

9. The power semiconductor module system as set forth in claim 1, wherein at least one of the first positioning elements is arranged at a side edge of the bottom side of the power semiconductor module.

10. The power semiconductor module system as set forth in claim 1, wherein at least one of the second positioning elements is arranged at a side edge of the top side of the heat sink.

11. The power semiconductor module system as set forth in claim 1, wherein in the first configuration, the power semiconductor module comprises a module housing and at least one of the first positioning elements is arranged spaced away from the first thermal contact surface at the module housing.

12. The power semiconductor module system as set forth in claim 1, wherein the first and second positioning elements are arranged asymmetrically so that the power semiconductor module is mountable twist-secured on the heat sink.

13. The power semiconductor module system as set forth in claim 1, wherein the first positioning elements and the corresponding second positioning elements are designed to prevent at least one of a form-locked joint and a force-locked joint between the power semiconductor module and the heat sink.

14. The power semiconductor module system as set forth in claim 1, wherein the at least one fastener enables at least one of a form-locked joint and a force-locked joint between the power semiconductor module and the heat sink.

15. The power semiconductor module system as set forth in claim 14, wherein the at least one fastener comprises a single fastener enabling the at least one of form-locked joint and force-locked joint.

16. The power semiconductor module system as set forth in claim 13, wherein at least one of the fasteners is configured as a screw by means of which the power semiconductor module can be screwed to the heat sink through a corresponding threaded hole in the heat sink.

17. A method of mounting a power semiconductor module on a heat sink, comprising:
    providing a power semiconductor module system comprising a power semiconductor module including a bottom side with a first thermal contact surface, a heat sink including a top side with a second thermal contact surface, and at least one fastener by means of which the power semiconductor module is conjoined with the heat sink, wherein the power semiconductor module comprises a number $N1 \geq 1$ of first positioning elements, the heat sink a number $N2 \geq 1$ of second positioning elements, each of the first positioning elements corresponding to one of the second positioning elements and forming a pair therewith, and the power semiconductor module and the heat sink are alignable relative to one another so that the two positioning elements of each of the pairs are interfitted when the power semiconductor module is mounted on the heat sink; wherein the power semiconductor module system has at least one of a first configuration and a second configuration, the first configuration comprising at least one of the first positioning elements being movable relative to the first thermal contact surface and being resiliently located by means of a resilient key for forced insertion at least partly into a receiving space provided on the power semiconductor module when mounting the power semiconductor module on the heat sink; and the second configuration comprising at least one of the second positioning elements being movable relative to the second thermal contact surface and being resiliently located by means of a resilient key for forced insertion at least partly into a receiving space provided on the heat sink when mounting the power semiconductor module on the heat sink;

positioning the power semiconductor module and the heat sink each relative to the other so that each first positioning element interfits at least partly the corresponding second positioning element; and producing a joint between the power semiconductor module and heat sink by means of at least one fastener.

18. The method as set forth in claim 17, wherein before positioning the power semiconductor module and the heat sink each relative to the other a heat-conductive paste is applied to at least one of the first thermal contact surface and the second thermal contact surface.

19. The method as set forth in claim 18, wherein in the first configuration, the heat-conductive paste is applied by means of a screen or by means of a stencil to the first thermal contact surface, and each first positioning element movable relative to the first thermal contact surface is urged temporarily completely into the receiving space of the power semiconductor module when the heat-conductive paste is applied.

20. The method as set forth in claim 18, wherein in the second configuration, at least one of the second positioning elements is configured as a protuberance movable relative to the second thermal contact surface, the heat-conductive paste is applied by means of a screen or by means of a stencil to the second thermal contact surface, and each second positioning element movable relative to the second thermal contact surface is urged temporarily completely into the receiving space of the heat sink when the heat-conductive paste is applied.

21. The method as set forth in 18, wherein the first thermal contact surface and the second thermal contact surface are spaced apart from each other when the power semiconductor module is mounted with its bottom side facing downward on the heat sink so that each first positioning element interfits the corresponding second positioning element, and the power semiconductor module is mounted with its bottom side facing downward on the heat sink so that each first positioning element interfits the corresponding second positioning element and the first thermal contact surface and second thermal contact surface have a spacing which is greater than the thickness of the applied heat-conductive paste.

* * * * *